(12) United States Patent
Tipirneni et al.

(10) Patent No.: US 8,759,879 B1
(45) Date of Patent: Jun. 24, 2014

(54) RESURF III-NITRIDE HEMTS

(71) Applicant: Texas Instruments Incorporated, Dallas, TX (US)

(72) Inventors: Naveen Tipirneni, Plano, TX (US); Sameer Pendharkar, Allen, TX (US); Jungwoo Joh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/886,688

(22) Filed: May 3, 2013

(51) Int. Cl.
*H01L 31/109* (2006.01)

(52) U.S. Cl.
USPC ...... 257/194; 257/76; 257/190; 257/E21.403; 257/E29.246

(58) Field of Classification Search
CPC ............ H01L 29/2003; H01L 29/7787; H01L 29/7783; H01L 29/66462
USPC ............. 257/76, 190, 194, E21.403, E29.246
See application file for complete search history.

(56) References Cited

U.S. PATENT DOCUMENTS 8,564,020 B2 * 10/2013 Chen et al. .................... 257/194
2003/0102482 A1 * 6/2003 Saxler ............................ 257/85

* cited by examiner

*Primary Examiner* — Dung Anh Le
(74) *Attorney, Agent, or Firm* — Jacqueline J. Garner; Wade J. Brady, III; Frederick J. Telecky, Jr.

(57) ABSTRACT

A semiconductor device containing a GaN FET has n-type doping in at least one III-N semiconductor layer of a low-defect layer and an electrical isolation layer below a barrier layer. A sheet charge carrier density of the n-type doping is 1 percent to 200 percent of a sheet charge carrier density of the two-dimensional electron gas.

20 Claims, 4 Drawing Sheets

RESURF III-NITRIDE HEMTS

FIELD OF THE INVENTION

This invention relates to the field of semiconductor devices. More particularly, this invention relates to GaN FETs in semiconductor devices.

BACKGROUND OF THE INVENTION

A gallium nitride field effect transistor (GaN FET) may have traps in semiconductor layers below the two-dimensional electron gas which cause undesirable instabilities during operation.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device containing a GaN FET has n-type doping in at least one III-N semiconductor layer below a two-dimensional electron gas forming a channel of the GaN FET. A sheet charge carrier density of the n-type doping shields the two-dimensional electron gas from trapped changes and image charges below the two-dimensional electron gas.

DETAILED DESCRIPTION OF EXAMPLE EMBODIMENTS

Figure 1:
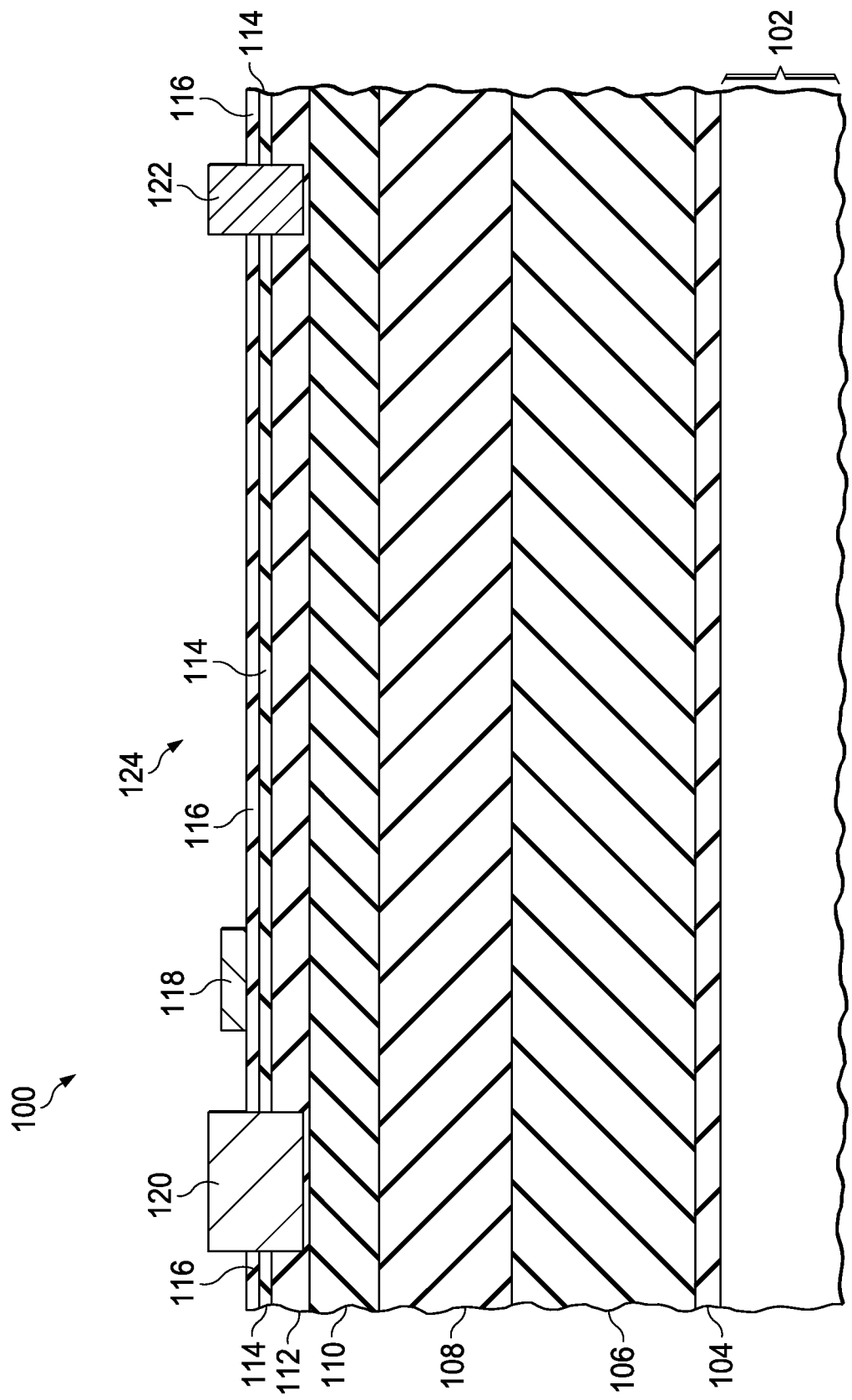
FIG. 1 through FIG. 4 are cross sections of exemplary semiconductor devices containing GaN FETs.

The following co-pending patent applications are related and hereby incorporated by reference:

U.S. patent application Ser. No. 13/886,378 (TI-71206 filed simultaneously with this application, entitled "AVALANCHE ENERGY HANDLING CAPABLE III-NITRIDE TRANSISTORS;"

U.S. patent application Ser. No. 13/886,410 (TI-71208 filed simultaneously with this application, entitled "III-NITRIDE ENHANCEMENT MODE TRANSISTORS WITH TUNABLE AND HIGH GATE-SOURCE VOLTAGE RATING;"

U.S. patent application Ser. No. 13/886,429 (TI-71209 filed simultaneously with this application, entitled "III-NITRIDE TRANSISTOR LAYOUT;"

U.S. patent application Ser. No. 13/886,652 (TI-71492 filed simultaneously with this application, entitled "LAYER TRANSFER OF SI100 ON TO III-NITRIDE MATERIAL FOR HETEROGENOUS INTEGRATION;"

U.S. patent application Ser. No. 13/886,709 (TI-72418 filed simultaneously with this application, entitled "METHOD TO FORM STEPPED DIELECTRIC FOR FIELD PLATE FORMATION;" and U.S. patent application Ser. No. 13/886,774 (TI-72605 filed simultaneously with this application, entitled "GaN DIELECTRIC RELIABILITY ENHANCEMENT."

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device containing a GaN FET has n-type doping in at least one III-N semiconductor layer below a two-dimensional electron gas forming a channel of the GaN FET. A sheet charge carrier density of the n-type doping shields the two-dimensional electron gas from trapped changes and image charges below the two-dimensional electron gas.

For the purposes of this description, the term "III-N" is understood to refer to semiconductor materials in which group III elements, that is, aluminum, gallium and indium, and possibly boron, provide a portion of the atoms in the semiconductor material and nitrogen atoms provide the remainder of the atoms in the semiconductor material. Examples of III-N semiconductor materials are gallium nitride, boron gallium nitride, aluminum gallium nitride, indium nitride, and indium aluminum gallium nitride. Terms describing elemental formulas of materials do not imply a particular stoichiometry of the elements. III-N materials may be written with variable subscripts to denote a range of possible stoichiometries. For example, aluminum gallium nitride may be written as $Al_xGa_{1-x}N$ and indium aluminum gallium nitride may be written as $In_xAl_yGa_{1-x-y}N$. For the purposes of this description, the term GaN FET is understood to refer to a field effect transistor which includes III-N semiconductor materials.

For the purposes of this description, the term "sheet charge carrier density" will be understood to mean a net areal density of free charge carriers per unit of top surface area for the structure of interest, in units of charge carriers per square centimeter. For example, the sheet charge carrier density of a two-dimensional electron gas is the number of electrons in the two-dimensional electron gas under a square centimeter at a top surface of a barrier layer which generates the two-dimensional electron gas. For another example, the sheet charge carrier density of an n-type doped layer is the number of electrons in a conduction band of the n-type doped layer under a square centimeter at a top surface of the n-type doped layer. The sheet charge carrier density of a doped layer may be estimated by integrating the doping density, in units of charge carriers per cubic centimeter, along a vertical axis, perpendicular to the top surface of the doped layer, from a bottom surface of the doped layer to the top surface.

For the purposes of this description, the term "RESURF" will be understood to refer to a material which reduces an electric field in an adjacent semiconductor region. A RESURF region may be for example a semiconductor region with an opposite conductivity type from the adjacent semiconductor region. RESURF structures are described in Appels, et. al., "Thin Layer High Voltage Devices" Philips J, Res. 35 1-13, 1980.

FIG. 1 through FIG. 4 are cross sections of exemplary semiconductor devices containing GaN FETs. Referring to FIG. 1, a semiconductor device 100 is formed on a substrate 102, which may be, for example, a silicon wafer, or other substrate appropriate for fabrication of GaN FETs. A mismatch isolation layer 104 is formed on the substrate 102. The mismatch isolation layer 104 may be, for example, 100 to 300 nanometers of aluminum nitride. A buffer layer 106 is formed on the mismatch isolation layer 104. The buffer layer 106 may be, for example, 1 to 7 microns thick and include a stack of graded layers of $Al_xGa_{1-x}N$ which is aluminum rich at the mismatch isolation layer 104 and gallium rich at a top surface of the buffer layer 106.

An electrical isolation layer 108 is formed on the buffer layer 106. The electrical isolation layer 108 may be, for example, 300 to 2000 nanometers of semi-insulating gallium nitride. The electrical isolation layer 108 may be, for example, semi-insulating to provide a desired level of electrical isolation between layers below the electrical isolation layer 108 and layers above the electrical isolation layer 608. Alternatively, the electrical isolation layer 108 may be doped with n-type or p-type dopants to reduce undesired effects of charge trapping on current density in the semiconductor device 100.

A low-defect layer 110 is formed on the electrical isolation layer 108. The low-defect layer 110 may be, for example, 25 to 1000 nanometers of gallium nitride. The low-defect layer 110 may be formed so as to minimize crystal defects which may have an adverse effect on electron mobility. The method of formation of the low-defect layer 110 may result in the low-defect layer 110 being doped with carbon, iron or other dopant species, for example with a doping density less than $10^{17}$ cm$^{-3}$.

A barrier layer 112 is formed on the low-defect layer 110. The barrier layer 112 may be, for example, 2 to 30 nanometers of $Al_xGa_{1-x}N$ or $In_xAl_yGa_{1-x-y}N$. A composition of group III elements in the barrier layer 112 may be, for example, 24 to 28 percent aluminum nitride and 72 to 76 percent gallium nitride. Forming the barrier layer 112 on the low-defect layer 110 generates a two-dimensional electron gas in the low-defect layer 110 just below the barrier layer 112 with an electron density, that is a sheet charge carrier density, for example, $1\times10^{12}$ to $2\times10^{13}$ cm$^{-2}$. An optional cap layer 114 may be formed on the barrier layer 112. The cap layer 114 may be, for example, 2 to 5 nanometers of gallium nitride. An optional gate dielectric layer 116 may be formed over the barrier layer 112, and the cap layer 114 if present, to provide a desired threshold voltage. The gate dielectric layer 116 may include, for example, silicon nitride.

During formation of the electrical isolation layer 108 and/or the low-defect layer 110, n-type dopants are added so that a sheet charge carrier density of the electrical isolation layer 108 and the low-defect layer 110 provides a screen for trapped charges and image charges below the two-dimensional electron gas. In one version of the instant example, the sheet charge carrier density of the electrical isolation layer 108 and the low-defect layer 110 may be 10 percent to 200 percent of the sheet charge carrier density of the two-dimensional electron gas.

The added n-type dopants may include, for example, mostly silicon and/or germanium dopants. The added n-type dopants may be added during epitaxial growth of the electrical isolation layer 108 and/or the low-defect layer 110. Alternatively, the added n-type dopants may be added by ion implantation after the electrical isolation layer 108 and/or the low-defect layer 110 is formed. An average doping density of the added n-type dopants may be, for example, $1\times10^{16}$ cm$^{-3}$ to $1\times10^{17}$ cm$^{-3}$. A distribution of the added n-type dopants may be substantially uniform, or may be graded so that a doping density is higher at a bottom of the doped region than at a top of the doped region.

A gate 118 is formed over the barrier layer 112, and on the gate dielectric layer 116 if present. The gate 118 may include, for example, III-N semiconductor material to provide a depletion mode FET. other types of gates are within the scope of the instant example. A source contact 120 is formed extending into the barrier layer 112, so as to form a tunneling connection to the two-dimensional electron gas in the low-defect layer 110. Similarly, a drain contact 122 is formed extending into the barrier layer 112, so as to form a tunneling connection to the two-dimensional electron gas. The gate 118, the source contact 120 and the drain contact 122 are part of a GaN FET 124 of the semiconductor device 100. In one version of the instant example, the semiconductor device 100 may contain other active components such as transistors or diodes besides the GaN FET 124. In another version, the GaN FET 124 may be the only active components of the semiconductor device 100. The source contact 120 may be laterally separated from the gate 118 by, for example, 500 to 1500 nanometers. The drain contact 122 is laterally separated from the gate 118 by a distance which depends on a maximum operating voltage of the GaN FET 124. For example, in a GaN FET 124 designed for a maximum operating voltage of 200 volts, the drain contact 122 may be laterally separated from the gate 118 by 1 to 8 microns. In a GaN FET 124 designed for a maximum operating voltage of 600 volts, the drain contact 122 may be laterally separated from the gate 118 by 8 to 20 microns. The GaN FET 124 may be formed in and on a different layer structure that that depicted in FIG. 1.

Figure 2:
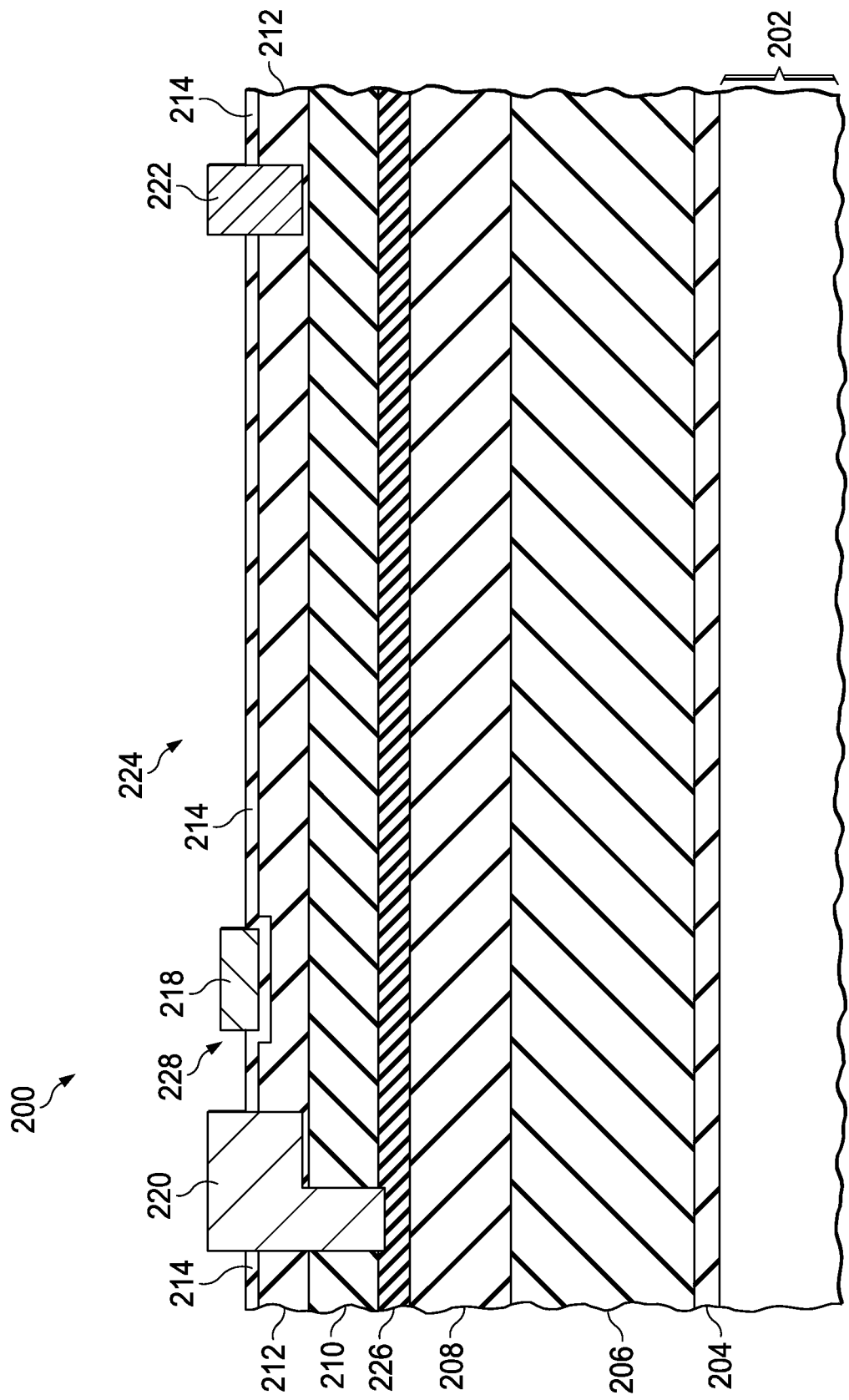

Referring to FIG. 2, a semiconductor device 200 is formed on a substrate 202, a mismatch isolation layer 204 is formed on the substrate 202, a buffer layer 206 is formed on the mismatch isolation layer 204, and an electrical isolation layer 208 is formed on the buffer layer 206, for example as described in reference to FIG. 1. In the instant example, the electrical isolation layer 208 is free of the added n-type dopants discussed in reference to FIG. 1.

A p-type gallium nitride layer 226 is formed on the electrical isolation layer 208. The p-type gallium nitride layer 226 may be, for example, 200 nanometers to 1200 nanometers thick, and may include a low fraction of aluminum and/or indium to match a stoichiometry of the electrical isolation layer 208. The p-type gallium nitride layer 226 is doped with p-type dopants such as magnesium with an exemplary doping density of $1\times10^{17}$ cm$^{-3}$ to $8\times10^{19}$ cm$^{-3}$. The p-type dopants may be added during epitaxial growth of the p-type gallium nitride layer 226 or may be added by ion implantation after the p-type gallium nitride layer 226 is formed.

A low-defect layer 210 is formed on the p-type gallium nitride layer 226. The low-defect layer 210 may be, for example, 50 to 1000 nanometers of gallium nitride. N-type dopants are added to the low-defect layer 210 so that a sheet charge carrier density of the low-defect layer 210 is 1 percent to 200 percent of the sheet charge carrier density of a subsequently generated two-dimensional electron gas. The doping density of the p-type gallium nitride layer 226 is selected to provide a sheet charge carrier density of 70 percent to 140 percent of the sheet charge carrier density of the low-defect layer 210.

A barrier layer 212 is formed on the low-defect layer 210, for example as described in reference to FIG. 1. Forming the barrier layer 212 on the low-defect layer 210 generates the two-dimensional electron gas in the low-defect layer 210 as described in reference to FIG. 1. An optional cap layer 214 may be formed on the barrier layer 212. An optional gate recess 228 may be formed in the barrier layer 212. The cap layer 214 is formed in the gate recess 228. A gate 218, for example a metal gate 218 of titanium tungsten, is formed on the cap layer 214 in the gate recess 228 to provide a depletion mode FET. Forming the gate 218 in the gate recess 228 may provide a desired threshold voltage. Other types of gates are within the scope of the instant example.

A drain contact 222 is formed in the barrier layer 212, for example as described in reference to FIG. 1. A source contact 220 is formed in the barrier layer 212 to make electrical contact with the two-dimensional electron gas. The source contact 220 may optionally also make electrical contact to the p-type gallium nitride layer 226. The gate 218, the source contact 220 and the drain contact 222 are part of a GaN FET 224 of the semiconductor device 200.

During operation of the semiconductor device 200, electrons provided by the added n-type dopants in the low-defect layer 210 may advantageously fill a portion of traps in the low-defect layer 210. The p-type gallium nitride layer 226 may provide a RESURF layer to advantageously lower an electric field from the gate 218 and so reduce movement of electrons into and out of the traps.

Figure 3:
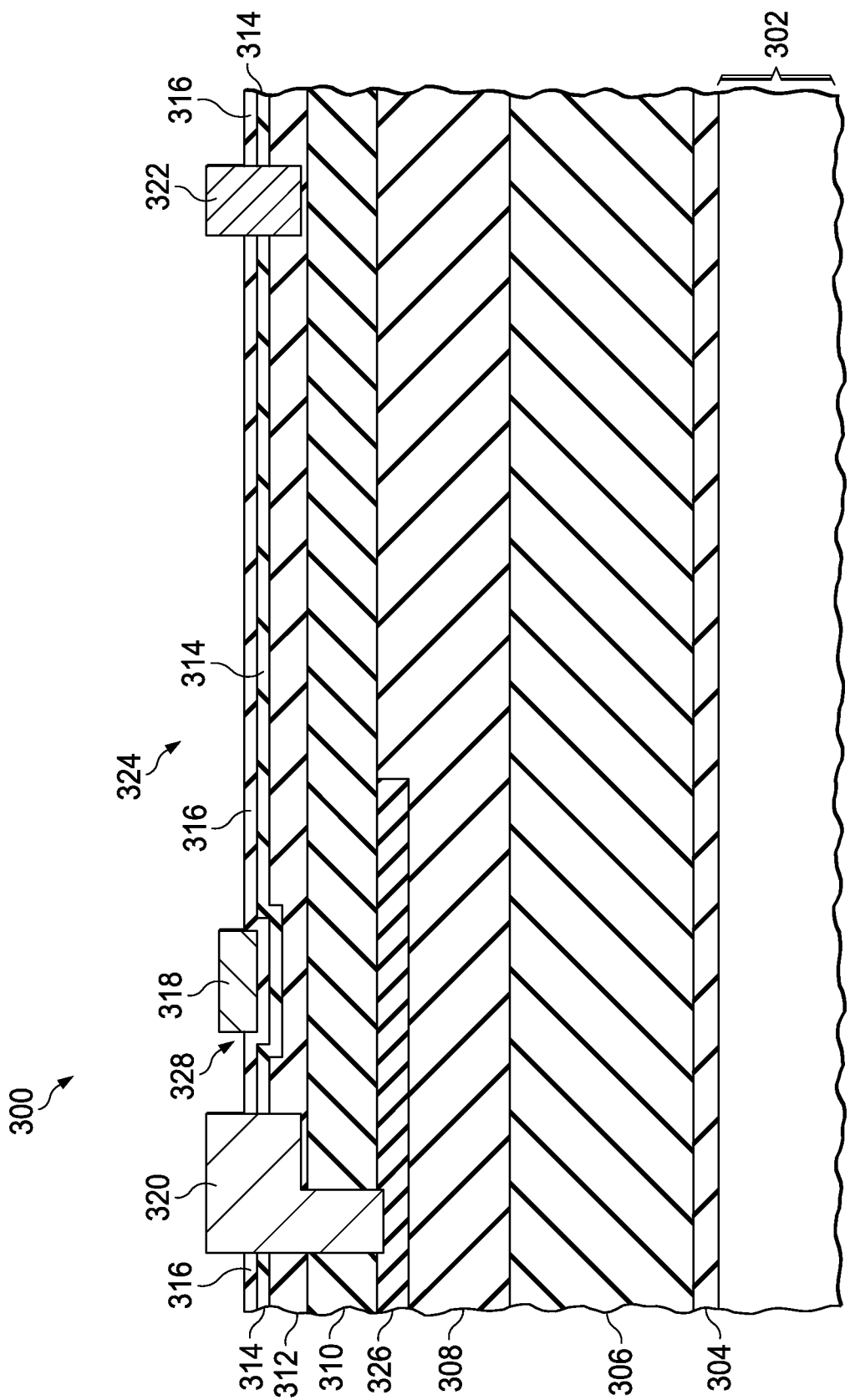

Referring to FIG. 3, a semiconductor device 300 is formed on a substrate 302, a mismatch isolation layer 304 is formed on the substrate 302, a buffer layer 306 is formed on the mismatch isolation layer 304, and an electrical isolation layer 308 is formed on the buffer layer 306, for example as described in reference to FIG. 1.

A patterned p-type gallium nitride layer 326 is formed on the electrical isolation layer 308, extending from a source contact area past a gate area, and stopping before a drain area. A thickness and doping characteristics of the patterned p-type gallium nitride layer 326 is as described in reference to FIG. 2. In one version of the instant example, the partial p-type gallium nitride layer 326 may be formed by ion implanting p-type dopants through an implant mask into a top portion of the electrical isolation layer 308 to convert it to p-type with the desired doping density. In another version, a blanket p-type gallium nitride layer may be grown using an epitaxial growth process, and subsequently patterned with an etch process.

A low-defect layer 310 is formed on the partial p-type gallium nitride layer 326 and the electrical isolation layer 308. The low-defect layer 310 may be, for example, 50 to 1000 nanometers of gallium nitride. During formation of the low-defect layer 310, and possibly the electrical isolation layer 308, n-type dopants are added so that a sheet charge carrier density of the low-defect layer 310 and the electrical isolation layer 308 is 1 percent to 200 percent of the sheet charge carrier density of a subsequently generated two-dimensional electron gas. The doping density of the partial p-type gallium nitride layer 326 is selected to provide a sheet charge carrier density of 70 percent to 140 percent of the sheet charge carrier density of the low-defect layer 310.

A barrier layer 312 is formed on the low-defect layer 310, for example as described in reference to FIG. 1. Forming the barrier layer 312 on the low-defect layer 310 generates the two-dimensional electron gas in the low-defect layer 310 as described in reference to FIG. 1. An optional cap layer 314 may be formed on the barrier layer 312. An optional gate recess 328 may be formed in the barrier layer 312. The cap layer 314 is formed in the gate recess 328. A gate dielectric layer 316 is formed over the cap layer 314 if present and over the barrier layer 312. The gate dielectric layer 316 may be, for example, 10 to 20 nanometers of silicon nitride formed by low pressure chemical vapor deposition (LPCVD) or plasma enhanced chemical vapor deposition (PECVD). In other version of the instant example, the gate dielectric layer 316 may include one or more layers of silicon nitride, silicon dioxide, silicon oxynitride and/or aluminum oxide. The gate dielectric layer 316 is formed in the gate recess 328. A metal gate 318 is formed on the gate dielectric layer 316 in the gate recess 328 to provide an enhancement mode FET. Forming the gate 318 in the gate recess 328 may provide a desired threshold voltage. Other types of gates are within the scope of the instant example.

A source contact 320 is formed in the barrier layer 312 to make electrical contact with the two-dimensional electron gas and the partial p-type gallium nitride layer 326 as described in reference to FIG. 2. A drain contact 322 is formed in the barrier layer 312, for example as described in reference to FIG. 1. The gate 318, the source contact 320 and the drain contact 322 are part of a GaN FET 324 of the semiconductor device 300.

During operation of the semiconductor device 300, the added n-type dopants in the low-defect layer 310 may advantageously fill a portion of traps as described in reference to FIG. 1 and FIG. 2. The partial p-type gallium nitride layer 326 may provide a RESURF layer to advantageously lower an electric field from the gate 318 as described in reference to FIG. 2. Forming the partial p-type gallium nitride layer 326 terminate before the drain region may increase a drain-source breakdown voltage of the GaN FET 324 compared to the GaN FET 224 of FIG. 2.

Figure 4:
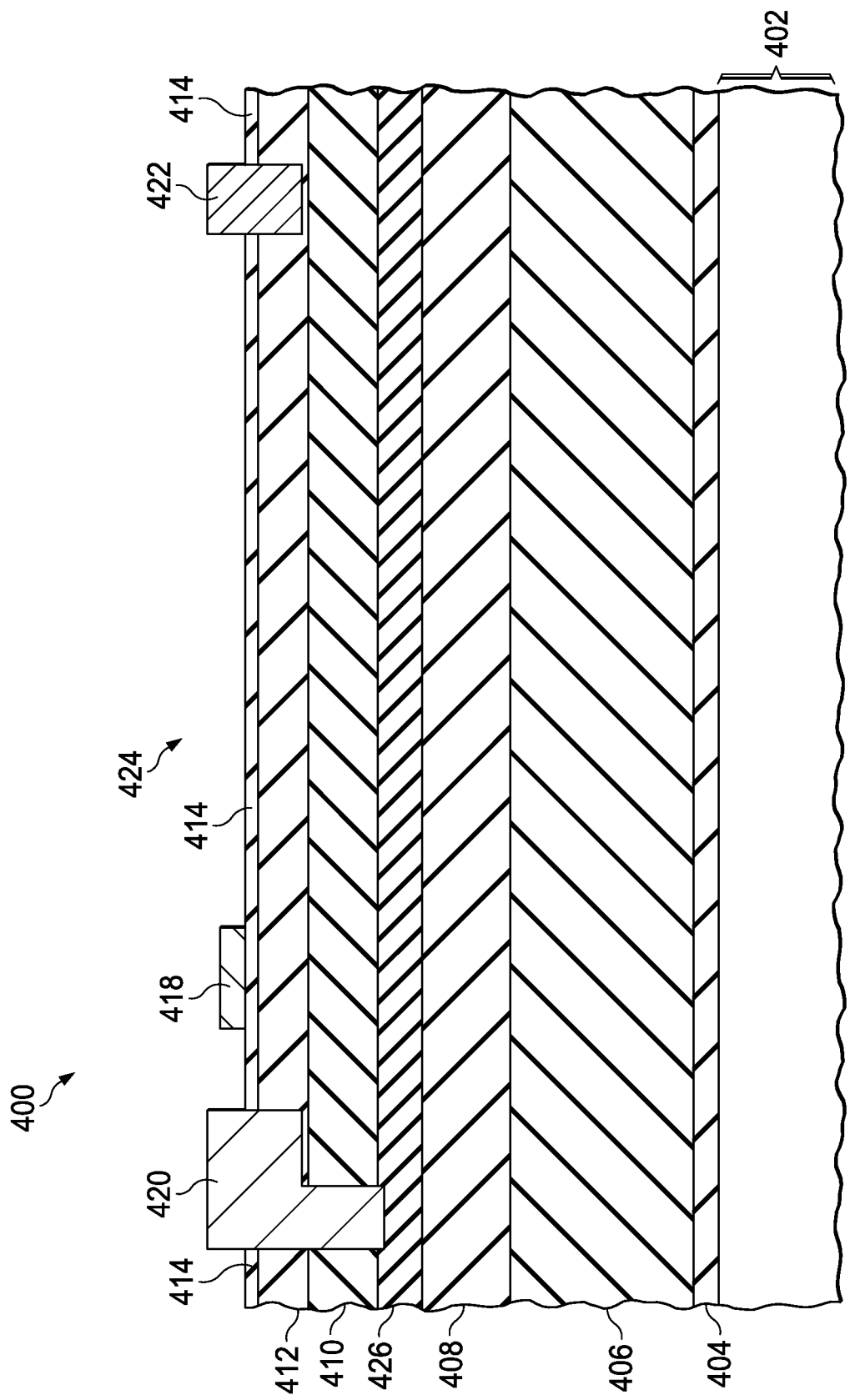

Referring to FIG. 4, a semiconductor device 400 is formed on a substrate 402, a mismatch isolation layer 404 is formed on the substrate 402, and a buffer layer 406 is formed on the mismatch isolation layer 404, for example as described in reference to FIG. 1.

A p-type gallium nitride layer 426 is formed on the buffer layer 406. A thickness and doping characteristics of the p-type gallium nitride layer 426 is as described in reference to FIG. 2. A low-defect layer 410 is formed on the p-type gallium nitride layer 426. The low-defect layer 410 may be, for example, 50 to 1000 nanometers of gallium nitride. During formation of the low-defect layer 410 n-type dopants are added so that a sheet charge carrier density of the low-defect layer 410 and the electrical isolation layer 408 is 1 percent to 200 percent of the sheet charge carrier density of a subsequently generated two-dimensional electron gas. The doping density of the p-type gallium nitride layer 426 is selected to provide a sheet charge carrier density of 70 percent to 140 percent of the sheet charge carrier density of the low-defect layer 410.

A barrier layer 412 is formed on the low-defect layer 410, for example as described in reference to FIG. 1. Forming the barrier layer 412 on the low-defect layer 410 generates the two-dimensional electron gas in the low-defect layer 410 as described in reference to FIG. 1. An optional cap layer 414 may be formed on the barrier layer 412. A p-type III-N semiconductor gate 418 is formed on the cap layer 414 to provide an enhancement mode FET. The p-type III-N semiconductor gate 418 may include, for example, one or more layers of $Al_xGa_{1-x}N$ or $In_xAl_yGa_{1-x-y}N$. The p-type III-N semiconductor gate 418 may include a metal layer over the semiconductor material.

A source contact 420 is formed in the barrier layer 412 to make electrical contact with the two-dimensional electron gas and the p-type gallium nitride layer 426 as described in reference to FIG. 2. A drain contact 422 is formed in the barrier layer 412, for example as described in reference to FIG. 1. The gate 418, the source contact 420 and the drain contact 422 are part of a GaN FET 424 of the semiconductor device 400.

During operation of the semiconductor device 400, the added n-type dopants in the low-defect layer 410 may advantageously fill a portion of traps as described in reference to FIG. 1 and FIG. 2. The p-type gallium nitride layer 426 may provide a RESURF layer to advantageously lower an electric field from the gate 418 as described in reference to FIG. 2. Forming the p-type gallium nitride layer 426 on the buffer layer 406 may advantageously reduce a fabrication cost and complexity of the semiconductor device 400.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
    a substrate;
    an electrical isolation layer formed over said substrate, said electrical isolation layer comprising mostly gallium nitride;
    a low-defect layer formed over said electrical isolation layer, said low-defect layer comprising mostly gallium nitride;
    a barrier layer of III-N semiconductor material formed on said low-defect layer; and
    a gate of a gallium nitride field effect transistor (GaN FET) formed over said barrier layer;
    in which at least one of said electrical isolation layer and said low-defect layer includes added n-type dopants so that a sheet charge carrier density of said added n-type dopants is 1 percent to 200 percent of a sheet charge carrier density of a two-dimensional electron gas in said low-defect layer, said two-dimensional electron gas being generated by formation of said barrier layer on said low-defect layer.

2. The semiconductor device of claim 1, further including a p-type gallium nitride layer formed between said electrical isolation layer and said low-defect layer, said p-type gallium nitride layer extending under a source contact of said GaN FET and under said gate, said p-type gallium nitride layer having a sheet charge carrier density of 70 percent to 140 percent of a sheet charge carrier density of said low-defect layer.

3. The semiconductor device of claim 2, in which said p-type gallium nitride layer does not extend under a drain contact of said GaN FET.

4. The semiconductor device of claim 2, in which a p-type dopant species of said p-type gallium nitride layer is mostly magnesium.

5. The semiconductor device of claim 2, in which a source contact of said GaN FET makes electrical contact to said p-type gallium nitride layer.

6. The semiconductor device of claim 1, in which said electrical isolation layer is substantially free of said added n-type dopants.

7. The semiconductor device of claim 1, in which said low-defect layer is substantially free of said added n-type dopants.

8. The semiconductor device of claim 1, in which an n-type dopant species of a majority of said added n-type dopants is selected from the group consisting of silicon and germanium.

9. The semiconductor device of claim 1, in which an n-type dopant species of said added n-type dopants is mostly carbon.

10. The semiconductor device of claim 1, in which said sheet charge carrier density of said added n-type dopants is 10 percent to 200 percent of said sheet charge carrier density of said two-dimensional electron gas.

11. The semiconductor device of claim 1, in which an average doping density of said added n-type dopants is $1 \times 10^{16}$ cm$^{-3}$ to $1 \times 10^{17}$ cm$^{-3}$.

12. The semiconductor device of claim 1, in which said added n-type dopants are substantially uniformly distributed.

13. The semiconductor device of claim 1, in which said added n-type dopants is graded so as to have a higher doping density at a bottom of added n-type dopants than at a top of said added n-type dopants.

14. A semiconductor device, comprising:
    a substrate;
    a p-type gallium nitride layer formed over said substrate;
    a low-defect layer formed over said p-type gallium nitride layer, said low-defect layer comprising mostly gallium nitride;
    a barrier layer of III-N semiconductor material formed on said low-defect layer; and
    a gate of a gallium nitride field effect transistor (GaN FET) formed over said barrier layer;
    in which:
        said low-defect layer includes added n-type dopants so that a sheet charge carrier density of said added n-type dopants is 1 percent to 200 percent of a sheet charge carrier density of a two-dimensional electron gas in said low-defect layer, said two-dimensional electron gas being generated by formation of said barrier layer on said low-defect layer; and
        said p-type gallium nitride layer has a sheet charge carrier density of 70 percent to 140 percent of said sheet charge carrier density of said low-defect layer.

15. The semiconductor device of claim 14, in which a p-type dopant species of said p-type gallium nitride layer is mostly magnesium.

16. The semiconductor device of claim 14, in which a source contact of said GaN FET makes electrical contact to said p-type gallium nitride layer.

17. The semiconductor device of claim 14, in which an n-type dopant species of said added n-type dopants is mostly silicon.

18. The semiconductor device of claim 14, in which an n-type dopant species of said added n-type dopants is mostly carbon.

19. The semiconductor device of claim 14, in which an average doping density of said added n-type dopants is $1 \times 10^{16}$ cm$^{-3}$ to $1 \times 10^{17}$ cm$^{-3}$.

20. The semiconductor device of claim 14, in which said added n-type dopants are substantially uniformly distributed.

* * * * *